(12) United States Patent
Kawano et al.

(10) Patent No.: US 7,737,771 B2
(45) Date of Patent: Jun. 15, 2010

(54) SEMICONDUCTOR INTEGRATED CIRCUIT

(75) Inventors: Harumi Kawano, Miyazaki (JP);
Osamu Kuroki, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 116 days.

(21) Appl. No.: 11/517,256

(22) Filed: Sep. 8, 2006

(65) Prior Publication Data
US 2007/0075591 A1 Apr. 5, 2007

(30) Foreign Application Priority Data
Sep. 22, 2005 (JP) ............... 2005-274874

(51) Int. Cl.
*G05F 1/10* (2006.01)
*G05F 3/02* (2006.01)

(52) U.S. Cl. ...................... 327/544; 327/530
(58) Field of Classification Search ............... 327/544
See application file for complete search history.

(56) References Cited
U.S. PATENT DOCUMENTS 6,414,557 B1 * 7/2002 Liu .................. 331/57
6,456,270 B1   9/2002 Itakura
7,057,529 B2 * 6/2006 Bourgault .............. 340/907
7,394,638 B2 * 7/2008 Ahmad et al. ........... 361/111

FOREIGN PATENT DOCUMENTS

JP    2000-310981    11/2000

* cited by examiner

*Primary Examiner*—Lincoln Donovan
*Assistant Examiner*—Daniel Rojas
(74) *Attorney, Agent, or Firm*—Volentine & Whitt, P.L.L.C.

(57) ABSTRACT

A bias generation circuit is between a power voltage node and ground voltage node at a far end from power voltage and ground voltage terminals. Reference voltage nodes are connected to an amplifier circuit block from the far end. The amplifier block is closer to the power supply source, and the bias generation circuit is distant therefrom. Even if the power supply voltage drops due to current constantly flowing in the amplification block and bias generation circuit, the bias generation circuit generates reference voltages at the reference voltage nodes based on the voltage-dropped power supply. Therefore, the voltage in the constant current source MOS transistor of the amplifier block becomes lowest at the amplifier circuit closest to the bias generation circuit. The response speeds of other amplifier circuits do not drop if the circuit is designed based on the amplifier closest to the bias generation circuit.

26 Claims, 6 Drawing Sheets

SEMICONDUCTOR INTEGRATED CIRCUIT

BACKGROUND OF THE INVENTION

1. Field of the Invention

The present invention relates to a semiconductor integrated circuit, and more particularly to a semiconductor integrated circuit having a circuit configuration that suppresses the influence of the process variation of wire resistance on characteristics of the semiconductor integrated circuit.

2. Description of the Related Art

Semiconductor integrated circuits which can decrease the variation of bias currents among chips to reduce the difference of current consumption among the chips and the difference of device characteristics are known in the art. Japanese Patent Application Laid-Open (Kokai) No. 2000-310981 (paragraph 0089), for example, discloses that the same bias current is supplied to each chip from the outside in order to suppress the current consumption difference and characteristic difference among different chips. The bias current is used to decide a current to flow in amplifiers of each chip. A bias generation circuit, which determines the bias current, is installed outside the chip, so that this circuit supplies the same bias current to each chip.

Japanese Patent Application Laid-Open No. 2000-310981 discloses a technology for installing the bias generation circuit outside the chip, and not for decreasing the variation of bias currents among a plurality of amplifier circuits, and decreasing the difference of current consumption and difference of device characteristics by deciding appropriate positions of the amplifier circuits and the bias generation circuit on a same chip. This Japanese Patent Application Laid-Open No. 2000-310981 does not provide a useful technology for suppressing the influence of process variation of the wiring resistance on characteristics of the products, because chips become long, such as the case of a semiconductor integrated circuit device used for a liquid crystal TFT driver, and power supply and ground wires from the power supply and ground supply terminals to the internal circuits become long.

SUMMARY OF THE INVENTION

It is an object of the present invention to provide a semiconductor integrated circuit which does not have the above mentioned problems.

According to the first aspect of the present invention, there is provided a semiconductor integrated circuit that includes a first constant potential supply line having a first constant potential supply terminal. The first constant potential supply line supplies a first constant potential. The semiconductor integrated circuit also includes a second constant potential supply line having a second constant potential supply terminal. The second constant potential supply line supplies a second constant potential. The semiconductor integrated circuit also includes a first bias generation circuit electrically connected to the first constant potential supply line and the second constant potential supply line, for generating a first reference potential and a second reference potential based on the first constant potential and the second constant potential, respectively. The semiconductor integrated circuit also includes a first reference potential line electrically connected to the first bias generation circuit, for supplying the first reference potential. The semiconductor integrated circuit also includes a second reference potential line electrically connected to the first bias generation circuit, for supplying the second reference potential. The semiconductor integrated circuit also includes a first analog circuit electrically connected to the first constant potential supply line and the second constant potential supply line. The first analog circuit is also electrically connected to the first reference potential line and the second reference potential line. The first analog circuit is placed between the first and the second constant potential supply terminals and the first bias generation circuit.

The wiring distance (length) of the first constant potential supply line between the first bias generation circuit and the first constant potential supply terminal is longer than the wiring distance (length) of the first constant potential supply line between the first analog circuit and the first constant potential supply terminal, and the wiring length of the second constant potential supply line between the first bias generation circuit and the second constant potential supply terminal is longer than the wiring length of the second constant potential supply line between the first analog circuit and the second constant potential supply terminal. Since the wiring resistance is in proportion to the wiring length, the wiring resistance of the first constant potential supply line between the first bias generation circuit and the first constant potential supply terminal is higher than the wiring resistance of the first constant potential supply line between the first analog circuit and the first constant potential supply terminal, and the wiring resistance of the second constant potential supply line between the first bias generation circuit and the second constant potential supply terminal is higher than the wiring resistance of the second constant potential supply line between the first analog circuit and the second constant potential supply terminal.

Therefore, even if the constant voltage drops due to the current constantly flowing in the first analog circuit and the first bias generation circuit, the first bias generation circuit generates the first and second reference voltages based on this dropped constant voltage. Thus, even if the values of the wiring resistance of the first and second constant potential supply lines change from the design values due to process variation, the potential difference that is applied to the first bias generation circuit is approximately the same as the design value, and the potential difference between the first and second reference potentials generated by the first bias generation circuit becomes approximately the same as the design value. Consequently the first analog circuit is not adversely affected.

DETAILED DESCRIPTION OF THE INVENTION

(1) First Embodiment

Figure 1:
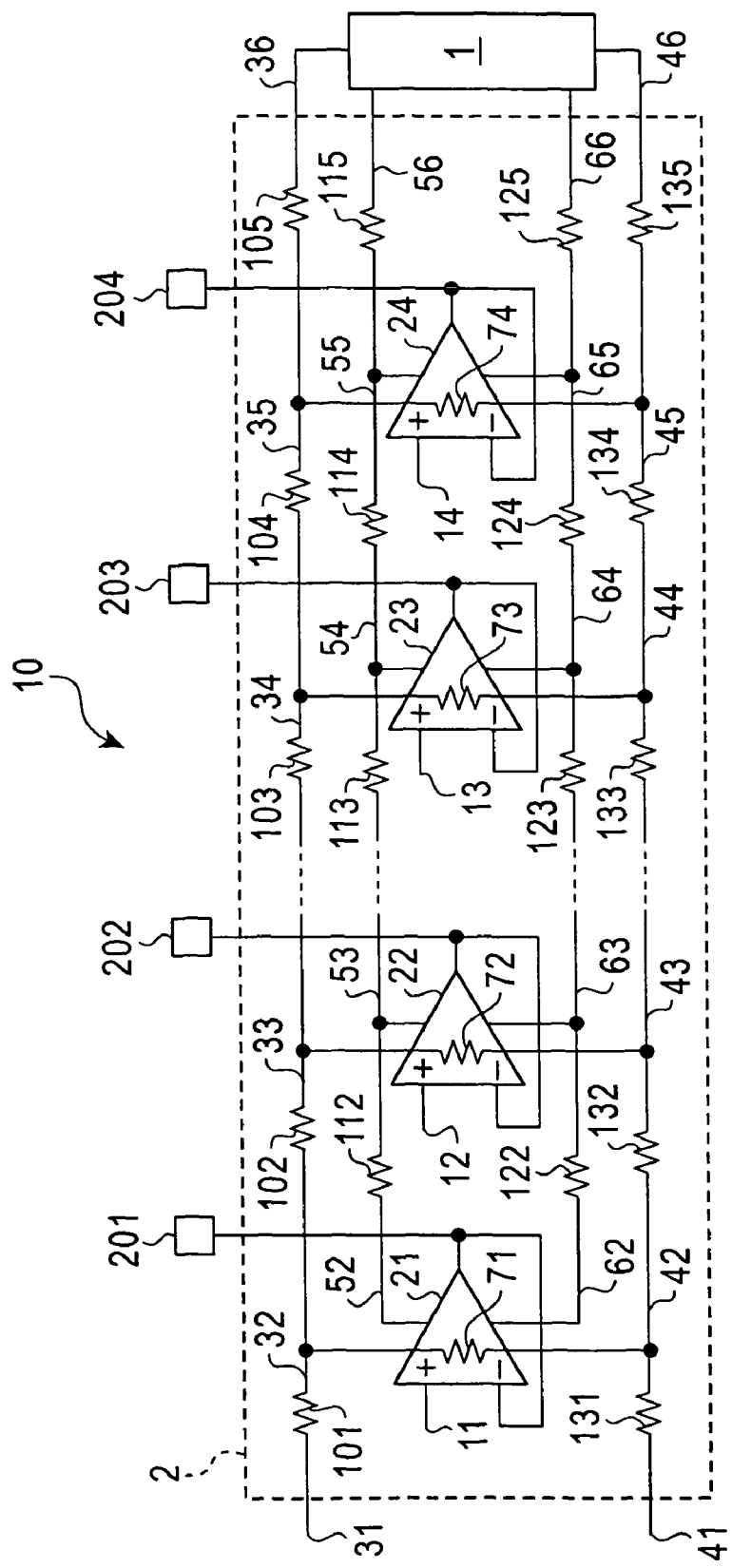
FIG. 1 is an equivalent circuit diagram depicting a circuit layout of a semiconductor integrated circuit according to the first embodiment of the present invention.
Figure 2:
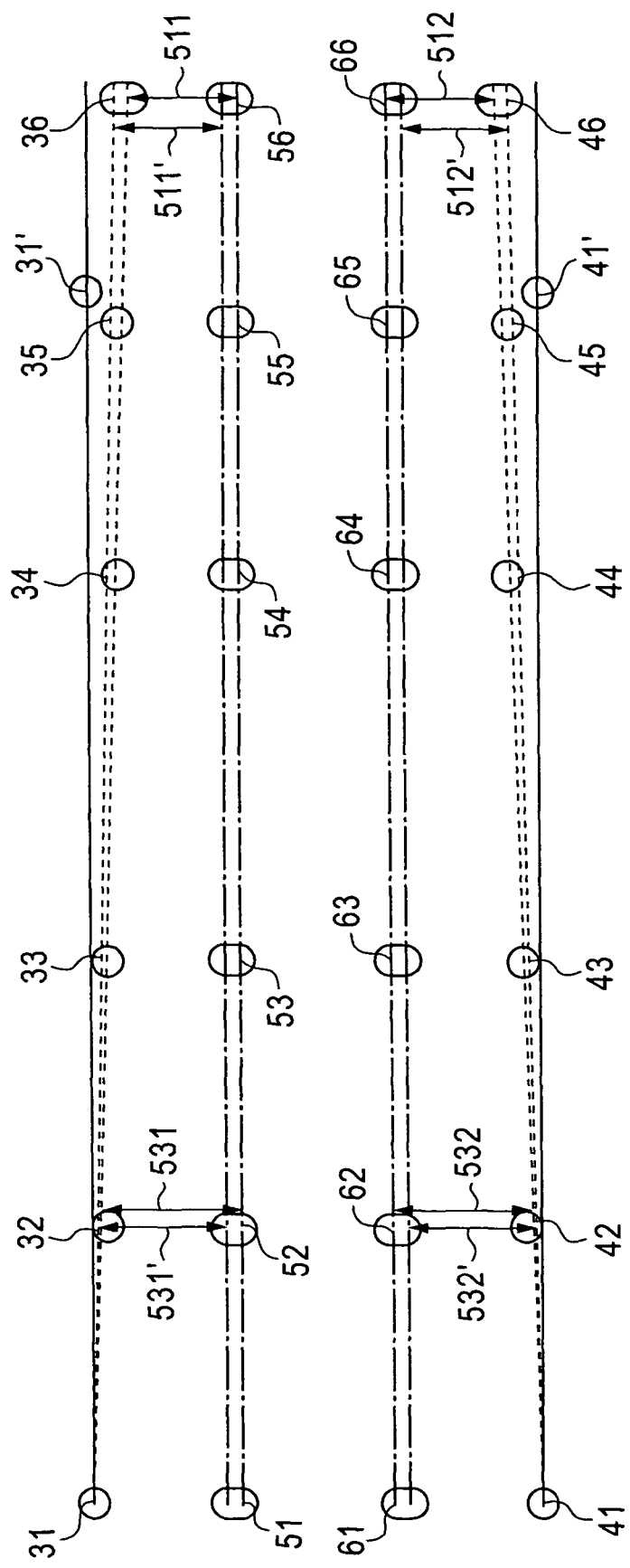
FIG. 2 is a diagram depicting the relationship between the power supply voltage and ground voltage and the reference bias voltage in the circuit layout in FIG. 1.

Referring to FIGS. 1 and 2, the first embodiment of the present invention will be described. The first embodiment is directed to a semiconductor integrated circuit 10 that is useful to suppress the influence of the process variation of wiring resistance on characteristics of the semiconductor integrated circuit.

The semiconductor integrated circuit 10 is mounted on one semiconductor chip. The semiconductor integrated circuit 10 has the following circuit configuration. A first constant potential supply line has a first constant potential supply terminal and supplies first constant potential. The first constant potential supply line can be a known power supply voltage supply line. The first constant potential supply terminal is for example a power supply voltage supply terminal 31. A second constant potential supply line has a second constant potential supply terminal, and supplies second constant potential. The second constant potential is different from the first constant potential. The second constant potential supply line can be a known ground voltage supply line. The second constant potential supply terminal is for example a ground voltage supply terminal 41.

A first bias generation circuit 1 is electrically connected to the first constant potential supply line and the second constant potential supply line, and generates first reference potential and second reference potential based on the first constant potential and the second constant potential, respectively. The first bias generation circuit 1 is electrically connected to a node 36 of the power supply voltage supply line and a node 46 of the ground voltage supply line. The node 36 of the power supply voltage supply line and the node 46 of the ground voltage supply line are nodes at the far end from the power supply voltage supply terminal 31 and the ground voltage supply terminal 41 respectively. The first bias generation circuit 1 generates first reference potential and second reference potential based on the power supply voltage supplied from the power supply voltage supply terminal 31 and ground voltage supplied from the ground voltage supply terminal 41.

A first reference potential line has a node 56, and is electrically connected to the first bias generation circuit 1 at the node 56. The first reference potential line supplies (carries) the first reference potential generated by the first bias generation circuit. A second reference potential line has a node 66, and is electrically connected to the first bias generation circuit 1 at the node 66. The second reference potential line supplies the second reference potential generated by the first bias generation circuit 1.

One or more analog circuits are electrically connected to the first constant potential supply line and the second constant potential supply line, and also electrically connected to the first reference potential line and the second reference potential line. These analog circuits are placed between the first and second constant potential supply terminals and the first bias generation circuit 1. Each analog circuit can be a known analog circuit, such as an amplifier circuit, which operates upon receiving a first constant potential, second constant potential, first reference potential and second reference potential, but is not limited to such amplifier circuit. The analog circuits are, for example, amplifier circuits 21 to 24. The analog circuits (i.e., the amplifier circuits 21 to 24) are placed between the first bias generation circuit 1 and the power supply voltage supply terminal 31 and ground voltage supply terminal 41.

The amplifier circuit 21 is electrically connected to a node 32 of the power supply voltage supply line and a node 42 of the ground voltage supply line, and is also electrically connected to a node 52 of the first reference potential supply line and a node 62 of the second reference potential supply line. Between the node 32 of the power supply voltage supply line and the power supply voltage supply terminal 31, a wiring resistor 101 of the power supply voltage supply line exists. Between the node 42 of the ground voltage supply line and the ground voltage supply terminal 41, a wiring resistor 131 of the ground voltage supply line exists. Between the node 32 of the power supply voltage supply line and the node 42 of the ground voltage supply line, a resistor 71 of the amplifier circuit 21 exists. The amplifier circuit 21 has a + input terminal 11, a – input terminal and an output terminal 201, and the – input terminal is electrically connected to the output terminal 201. Between the node 52 of the first reference potential supply line and the first bias generation circuit 1, wiring resistors 112, 113, 114 and 115 of the first reference potential supply line exist. Between the node 62 of the second reference potential supply line and the first bias generation circuit 1, wiring resistors 122, 123, 124 and 125 of the second reference potential supply line exist.

The amplifier circuit 22 is electrically connected to a node 33 of the power supply voltage supply line and a node 43 of the ground voltage supply line, and is also electrically connected to a node 53 of the first reference potential supply line and a node 63 of the second reference potential supply line. Between the node 33 of the power supply voltage supply line and the power supply voltage supply terminal 31, the wiring resistors 101 and 102 of the power supply voltage supply line exist. Between the node 43 of the ground voltage supply line and the ground voltage supply terminal 41, wiring resistors 131 and 132 of the ground voltage supply line exist. Between the node 33 of the power supply voltage supply line and the node 43 of the ground voltage supply line, a resistor 72 of the amplifier circuit 22 exists. The amplifier circuit 22 has a + input terminal 12, a – input terminal and an output terminal 202, and the – input terminal is electrically connected to the output terminal 202. Between the node 53 of the first reference potential supply line and the first bias generation circuit 1, wiring resistors 113, 114 and 115 of the first reference potential supply line exist. Between the node 63 of the second reference potential supply line and the first bias generation circuit 1, wiring resistors 123, 124 and 125 of the second reference potential supply line exist.

The amplifier circuit 23 is electrically connected to a node 34 of the power supply voltage supply line and a node 44 of the ground voltage supply line, and is also electrically connected to a node 54 of the first reference potential supply line and a node 64 of the second reference potential supply line. Between the node 34 of the power supply voltage supply line and power supply voltage supply terminal 31, the wiring resistors 101, 102 and 103 of the power supply voltage supply line exist. Between the node 44 of the ground voltage supply line and ground voltage supply terminal 41, the wiring resistors 131, 132 and 133 of the ground voltage supply line exist. Between the node 34 of the power supply voltage supply line and the node 44 of the ground voltage supply line, a resistor 73 of the amplifier circuit 23 exists. The amplifier circuit 23 has a + input terminal 13, a – input terminal, and an output terminal 203, and the – input terminal is electrically connected to the output terminal 203. Between the node 54 of the first reference potential supply line and the first bias generation circuit 1, wiring resistors 114 and 115 of the first reference potential supply line exist. Between the node 64 of the second reference potential supply line and the first bias generation circuit 1, wiring resistors 124 and 125 of the second reference potential supply line exist.

The amplifier circuit 24 is electrically connected to a node 35 of the power supply voltage supply line and a node 45 of the ground voltage supply line, and is also electrically connected to a node 55 of the first reference potential supply line and a node 65 of the second reference potential supply line. Between the node 35 of the power supply voltage supply line and the power supply voltage supply terminal 31, the wiring resistors 101, 102, 103 and 104 of the power supply voltage supply line exist. Between the node 45 of the ground voltage supply line and the ground voltage supply terminal 41, the wiring resistors 131, 132, 133 and 134 of the ground voltage supply line exist. Between the node 35 of the power supply voltage supply line and the node 45 of the ground voltage supply line, a resistor 74 of the amplifier circuit 24 exists. The amplifier circuit 24 has a + input terminal 14, a − input terminal and an output terminal 204, and the − input terminal is electrically connected to the output terminal 204. Between the node 55 of the first reference potential supply line and the first bias generation circuit 1, a wiring resistor 115 of the first reference potential supply line exists. Between the node 65 of the second reference potential supply line and the first bias generation circuit 1, a wiring resistor 125 of the second reference potential supply line exists.

The first bias generation circuit 1 is electrically connected to a node 36 of the power supply voltage supply line and a node 46 of the ground voltage supply line, and is also electrically connected to a node 56 of the first reference potential supply line and a node 66 of the second reference potential supply line. Between the node 36 of the power supply voltage supply line and the power supply voltage supply terminal 31, the wiring resistors 101, 102, 103, 104 and 105 of the power supply voltage supply line exist. Between the node 46 of the ground voltage supply line and the ground voltage supply terminal 41, the wiring resistors 131, 132, 133, 134 and 135 of the ground voltage supply line exist.

As understood from the foregoing, the amplifier circuit 21 is placed between the power supply voltage supply terminal 31 and ground voltage supply terminal 41 and the amplifier circuit 22. The amplifier circuit 22 is placed between the amplifier circuit 21 and the amplifier circuit 23. The amplifier circuit 23 is placed between the amplifier circuit 22 and the amplifier circuit 24. The amplifier circuit 24 is placed between the amplifier circuit 23 and the first bias generation circuit 1.

In other words, the first bias generation circuit 1 is placed at a position such that the wiring distance (length) to the first bias generation circuit 1 from the power supply voltage supply terminal 31 and the ground voltage supply terminal 41 is longer than the wiring distance (length) to the first bias generation circuit 1 from the amplifier circuits 21 to 24. The wiring distance is a length of the first constant potential supply line and the second constant potential supply line. Since the first constant potential supply line and the second constant potential supply line have wiring resistors, voltage decreases more as the wiring distance from the power supply voltage supply terminal 31 and the ground voltage supply terminal 41 increases. Accordingly, the wiring distance from the power supply voltage supply terminal 31 and the ground voltage supply terminal 41 to the nodes 36 and 46, at which the first bias generation circuit 1 is connected to the first constant potential supply line and the second constant potential supply line respectively, is longer than that to the nodes 32 and 42, nodes 33 and 43, nodes 34 and 44 and nodes 35 and 45 at which the amplifier circuits 21 to 24 are connected to the first constant potential supply line and the second constant potential supply line respectively.

Thus, the bias generation circuit 1 is installed between the power supply voltage node 36 and the ground voltage node 46 which are at the far end from the power supply voltage supply terminal 31 and ground voltage supply terminal 41, and the reference voltage node 56 and the node 66 are connected to the amplifier circuit block 2 from the far end. In an actual chip layout as well, the amplifier circuit block 2 is placed closer to the power supply source, and the bias generation circuit 1 is placed more distant from the power supply source.

The power supply voltage of the amplifier circuit 21 in the amplifier circuit block 2 is connected (fed) to the node 32, the ground voltage is connected to the node 42, and the reference voltage is connected to the node 52 and node 62. The power supply voltage of the amplifier circuit 22 is connected to the node 33, the ground voltage is connected to the node 43, and the reference voltage is connected to the node 53 and node 63. The power supply voltage of the amplifier circuit 23 is connected to the node 34, the ground voltage is connected to the node 44, and the reference voltage is connected to the node 54 and node 64. The power supply voltage of the amplifier circuit 24 is connected to the node 35, the ground voltage is connected to the node 45, and the reference voltage is connected to the node 55 and node 65.

The wiring resistors 71, 72, 73 and 74 in the amplifier circuits 21, 22, 23 and 24 are illustrated in FIG. 1 for expressing the currents that flow in the amplifier circuits, which will be described later.

The power supply voltage node 31 is connected to the node 32 via the wiring resistor 101, the node 32 is connected to the node 33 via the wiring resistor 102, the node 33 is connected to the node 34 via the wiring resistor 103, the node 34 is connected to the node 35 via the wiring resistor 104, and the node 35 is connected to the node 36 via the wiring resistor 105. The ground voltage node 41 is connected to the node 42 via the wiring resistor 131, the node 42 is connected to the node 43 via the wiring resistor 132, the node 43 is connected to the node 44 via the wiring resistor 133, the node 44 is connected to the node 45 via the wiring resistor 134, and the node 45 is connected to the node 46 via the wiring resistor 135. The reference voltage node 56 is connected to the node 55 via the wiring resistor 115, the node 52 is connected to the node 53 via the wiring resistor 112, the node 53 is connected to the node 54 via the wiring resistor 113, and the node 54 is connected to the node 55 via the wiring resistor 114. The reference voltage node 66 is connected to the node 65 via the wiring resistor 125, the node 62 is connected to the node 63 via the wiring resistor 122, the node 63 is connected to the node 64 via the wiring resistor 123, and the node 64 is connected to the node 65 via the wiring resistor 124. The wiring resistors 101, 102, 103, 104, 105, 112, 113, 114, 115, 122, 123, 124, 125, 131, 132, 133, 134 and 135 are wiring resistors inherently contained in the wiring metal. The node 52, 53, 54, 55 is connected to a gate of a constant current source PMOS transistor in each amplifier circuit 21, 22, 23, 24, and the node 62, 63, 64, 65 is connected to a gate of a constant current source NMOS transistor in each amplifier circuit 21, 22, 23, 24.

The wires and circuit elements are integrated onto one semiconductor chip. The first bias generation circuit 1 can have a known circuit configuration. Also each of the amplifier circuits 21 to 24 can have a known circuit configuration.

Now, the operation of the semiconductor integrated circuit 10 will be described with reference to FIG. 2.

In the semiconductor integrated circuit 10 shown in FIG. 1, the basic operation is that the analog voltage levels of the input terminals 11, 12, 13 and 14 of the four amplifier circuits 21, 22, 23 and 24 are given to the associated output terminals 201, 202, 203 and 204 respectively, as shown in FIG. 2.

The relationship between the power supply voltage and ground voltage and the bias voltage according to the positions of the various elements of the semiconductor integrated circuit 10 will be described next. Since the bias generation circuit 1 is placed between the power supply voltage node 36 and the ground voltage node 46, the voltages at the nodes 56 and 66 are determined based on the voltages at the nodes 36 and 46. Current is always flowing in each amplifier circuit 21 to 24, so that voltage drops at each amplifier circuit 21 to 24 (as indicated by dotted lines), and a potential difference is generated among the power supply voltage nodes 32 to 36 and among the ground voltage nodes 42 to 46. The voltage drop is particularly large in the nodes 36 and 46, which are most distant from the power supply voltage supply terminal 31 and ground voltage supply terminal 41 (i.e., most distant from the power supply side). In FIG. 2, an ideal power supply voltage 31' and ideal ground potential 41', i.e., when no voltage drop occurs, are indicated by solid lines.

The wire of the reference voltage from the bias generation circuit 1 is in high impedance status, so that voltage does not drop and the levels of the nodes 52 to 56 are the same, and the levels of the nodes 62 to 66 are also the same.

As described above, according to the first embodiment of the present invention, the power supply voltage node 36 and ground voltage node 46 of the bias generation circuit 1 are placed at the very far end from the power supply voltage supply node 31 and ground voltage supply node 41. Therefore, even if the power supply voltage drops due to the current which constantly flows in the amplifier circuits 21 to 24 and bias generation circuit 1, the bias generation circuit 1 supplies the reference voltage to the reference voltage nodes 56 and 66 based on the power supply of which voltage has dropped. Thus, among the voltages Vgs of the constant current source MOS transistors of the amplifier circuits 21 to 24, the voltage Vgs at the amplifier circuit 24, which is closest to the bias generation circuit 1, is the lowest. If the semiconductor integrated circuit 10 is designed based on the amplifier circuit 24, the response speed of the other amplifier circuits 21 to 23 does not decrease.

Also even if the finish values of the power supply wiring resistances change because of the process variation, the potential difference between the power supply voltage node 36 and the reference voltage node 56 is substantially constant, i.e., the potential difference 511 when the wiring resistance value is high and the potential difference 511' when the wiring resistance value is low in FIG. 2 are approximately the same. Further, the potential difference between the ground voltage node 46 and the reference voltage node 66 is substantially constant, i.e., the potential difference 512 when the wiring resistance value is high and the potential difference 512' when it is low are approximately the same in FIG. 2. Thus, the voltage Vgs of the constant current source MOS transistor, that is the potential differences 531, 531', 532 and 532' in FIG. 2, are higher than the voltage Vgs of the constant current source MOS transistor of the amplifier circuit 24. Therefore, the response speed does not decrease.

If the semiconductor integrated circuit 10 is designed on the assumption that the wiring resistance value is high, the voltage Vgs of the constant current source MOS transistor near the power supply voltage supply terminal 31 and ground voltage supply terminal 41 (i.e., near the power supply side), that is, at the far from the bias generation circuit 1, is small even if the wiring resistance value is in fact low. Thus, current consumption decreases.

(2) Second Embodiment

Figure 3:
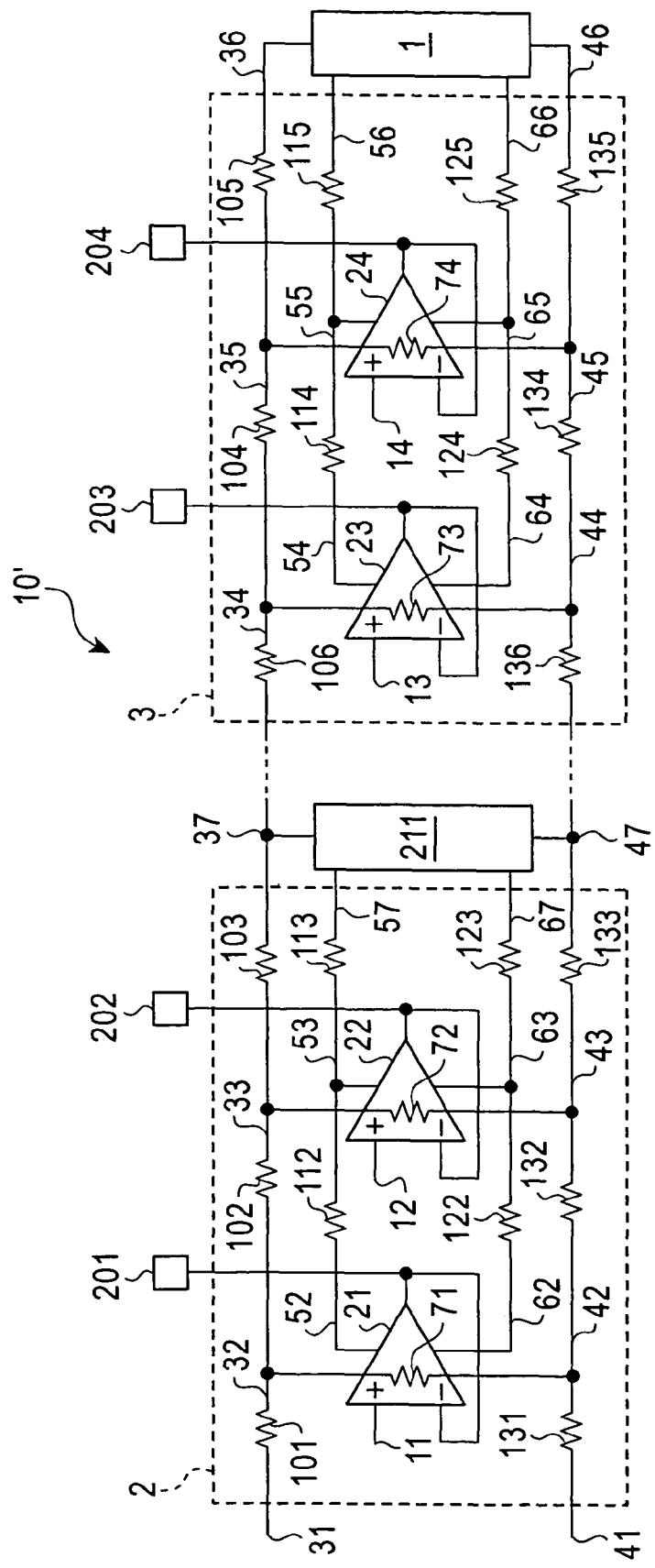
FIG. 3 is an equivalent circuit diagram depicting the circuit layout of the semiconductor integrated circuit according to the second embodiment of the present invention.
Figure 4:
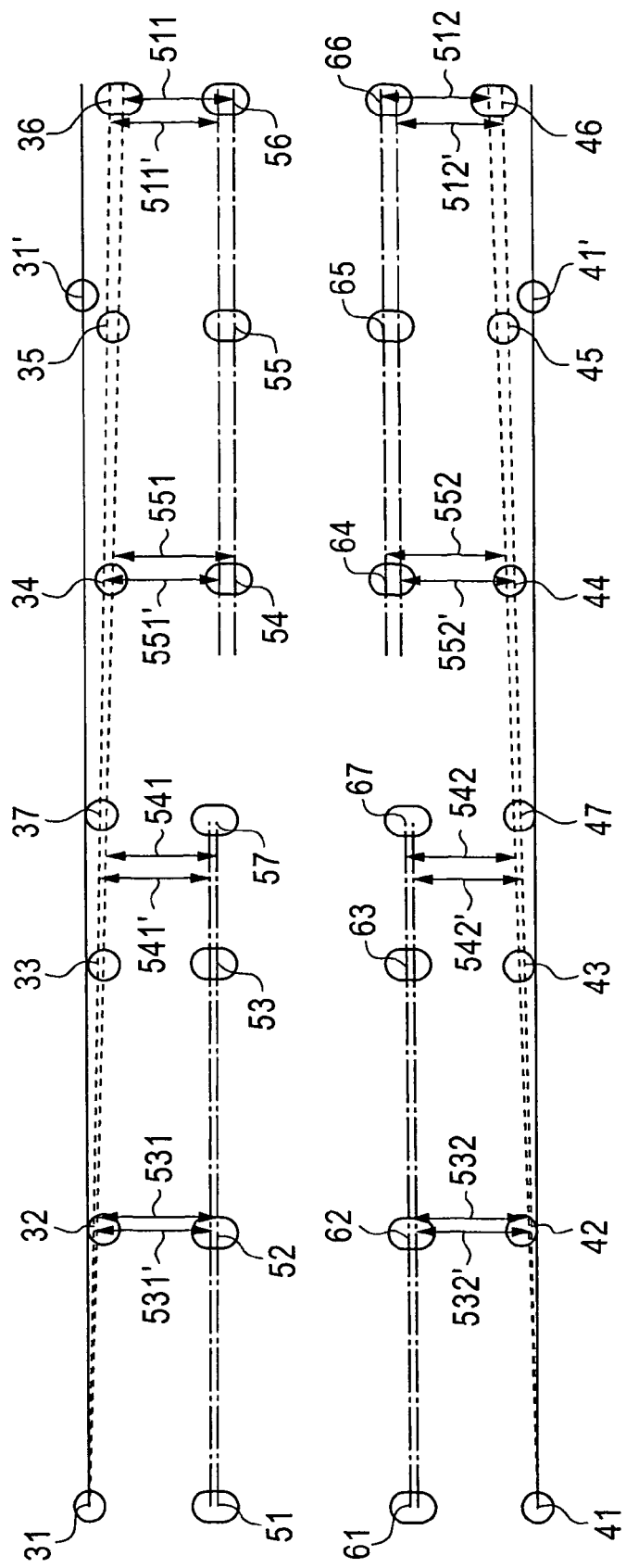
FIG. 4 is a diagram depicting the relationship between the power supply voltage and ground voltage and the reference bias voltage in the circuit layout in FIG. 3.

Referring to FIGS. 3 and 4, the second embodiment of the present invention will be described. The second embodiment is directed to a semiconductor integrated circuit 10' that is useful to suppress the influence of the process variation of wiring resistance on characteristics of the semiconductor integrated circuit 10'. FIG. 3 is an equivalent circuit diagram depicting a circuit layout of a semiconductor integrated circuit 10' according to the second embodiment of the present invention. FIG. 4 depicts the relationship between the power supply voltage and ground voltage and the reference bias voltage in the circuit layout of FIG. 3. Similar reference numerals are used in the first and second embodiments to designate similar elements.

The semiconductor integrated circuit 10' is mounted on one semiconductor chip. The semiconductor integrated circuit 10' has the following circuit configuration. A first constant potential supply line has a first constant potential supply terminal and supplies first constant potential. The first constant potential supply line can be a known power supply voltage supply line. The first constant potential supply terminal is for example a power supply voltage supply terminal 31. A second constant potential supply line has a second constant potential supply terminal, and supplies second constant potential. The second constant potential is different from the first constant potential. The second constant potential supply line can be a known ground voltage supply line. The second constant potential supply terminal is for example a ground voltage supply terminal 41.

A first bias generation circuit 1 is electrically connected to the first constant potential supply line and second constant potential supply line, and generates first reference potential and second reference potential based on the first constant potential and second constant potential, respectively. The first bias generation circuit 1 is electrically connected to a node 36 of the power supply voltage supply line and a node 46 of the ground voltage supply line. The node 36 of the power supply voltage supply line and node 46 of the ground voltage supply line are far end nodes from the power supply voltage supply terminal 31 and ground voltage supply terminal 41. The first bias generation circuit 1 generates first reference potential and second reference potential based on the power supply voltage supplied from the power supply voltage supply terminal 31 and ground voltage supplied from the ground voltage supply terminal 41, respectively.

A first reference potential line has a node 56, and is electrically connected to the first bias generation circuit 1 at the node 56. The first reference potential line supplies the first reference potential generated by the first bias generation circuit. A second reference potential line has a node 66, and is electrically connected to the first bias generation circuit 1 at the node 66. The second reference potential line supplies the second reference potential generated by the first bias generation circuit.

A second bias generation circuit 211 is electrically connected to the first constant potential supply line and the second constant potential supply line, and generates first reference potential and second reference potential based on the first constant potential and the second constant potential, respectively. The second bias generation circuit 211 is electrically connected to a node 37 of the power supply voltage supply line and a node 47 of the ground voltage supply line.

The node 37 of the power supply voltage supply line and the node 47 of the ground voltage supply line are nodes at an intermediate distance from the power supply voltage supply terminal 31 and ground voltage supply terminal 41. The second bias generation circuit 211 generates third reference potential and fourth reference potential based on the power supply voltage supplied from the power supply voltage supply terminal 31 and the ground voltage supplied from the ground voltage supply terminal 41, respectively.

A first analog circuit block 2 is placed between the second bias generation circuit 211 and the power supply voltage supply terminal 31 and ground voltage supply terminal 41. The first analog circuit block 2 is electrically connected to the second bias generation circuit 211 via a node 37 of the power supply voltage supply line and a node 47 of the ground voltage supply line. The first analog circuit block 2 includes one or more analog circuits. These analog circuits are electrically connected to the first constant potential supply line and second constant potential supply line, and are also electrically connected to the third reference potential line and fourth reference potential line. The analog circuits are placed between the first and second constant potential supply terminals and the second bias generation circuit 211. Each analog circuit can be a known analog circuit, such as an amplifier circuit, which operates receiving the first constant potential, second constant potential, third reference potential and fourth reference potential, but is not limited to such amplifier circuit. For example, the analog circuits include amplifier circuits 21 and 22. The analog circuits are placed between the second bias generation circuit 211 and the power supply voltage supply terminal 31 and ground voltage supply terminal 41. Specifically, the amplifier circuits 21 and 22 are placed between the second bias generation circuit 211 and the power supply voltage supply terminal 31 and ground voltage supply terminal 41.

The amplifier circuit 21 is electrically connected to a node 32 of the power supply voltage supply line and a node 42 of the ground voltage supply line, and is also electrically connected to a node 52 of the third reference potential supply line and a node 62 of the fourth reference potential supply line. Between the node 32 of the power supply voltage supply line and the power supply voltage supply terminal 31, a wiring resistor 101 of the power supply voltage supply line exists. Between the node 42 of the ground voltage supply line and ground voltage supply terminal 41, a wiring resistor 131 of the ground voltage supply line exists. Between the node 32 of the power supply voltage supply line and the node 42 of the ground voltage supply line, a resistor 71 of the amplifier circuit 21 exists. The amplifier circuit 21 has a + input terminal 11, a − input terminal, and an output terminal 201, and the − input terminal is electrically connected to the output terminal 201. Between the node 52 of the third reference potential supply line and second bias generation circuit 211, wiring resistors 112 and 113 of the third reference potential supply line exist. Between the node 62 of the fourth reference potential supply line and second bias generation circuit 211, wiring resistors 122 and 123 of the fourth reference potential supply line exist.

The amplifier circuit 22 is electrically connected to a node 33 of the power supply voltage supply line and a node 43 of the ground voltage supply line, and is also electrically connected to a node 53 of the third reference potential supply line and a node 63 of the fourth reference potential supply line. Between the node 33 of the power supply voltage supply line and power supply voltage supply terminal 31, the wiring resistors 101 and 102 of the power supply voltage supply line exist. Between the node 43 of the ground voltage supply line and ground voltage supply terminal 41, wiring resistors 131 and 132 of the ground voltage supply line exist. Between the node 33 of the power supply voltage supply line and the node 43 of the ground voltage supply line, a resistor 72 of the amplifier circuit 22 exists. The amplifier circuit 22 has a + input terminal 12, a − input terminal, and an output terminal 202, and the − input terminal is electrically connected to the output terminal 202. Between the node 53 of the third reference potential supply line and the second bias generation circuit 211, a wiring resistor 113 of the third reference potential supply line exists. Between the node 63 of the fourth reference potential supply line and second bias generation circuit 211, a wiring resistor 123 of the fourth reference potential supply line exists.

A second analog circuit block 3 is placed between the first bias generation circuit 1 and second bias generation circuit 211. In other words, the second bias generation circuit 211 is placed between the first analog circuit block 2 and second analog circuit block 3. The second analog circuit block 3 is electrically connected to the first bias generation circuit 1 via the node 36 of the power supply voltage supply line and the node 46 of the ground voltage supply line. The second analog circuit block 3 includes one or more analog circuits. These analog circuits are electrically connected to the first constant potential supply line and second constant potential supply line, and are also electrically connected to the first reference potential line and second reference potential line. The analog circuits are placed between the first bias generation circuit 1 and second bias generation circuit 211. Each analog circuit can be a known analog circuit, such as an amplifier circuit, which operates receiving a first constant potential, second constant potential, first reference potential and second reference potential, but is not limited to such amplifier circuit. The analog circuits are, for example, amplifier circuits 23 and 24. The analog circuits are placed between the first bias generation circuit 1 and second bias generation circuit 211. Specifically, the amplifier circuits 23 and 24 are placed between the first bias generation circuit 1 and second bias generation circuit 211.

The amplifier circuit 23 is electronically connected to a node 34 of the power supply voltage supply line and a node 44 of the ground voltage supply line, and is electrically connected to a node 54 of the first reference potential supply line and a node 64 of the second reference potential supply line. Between the node 34 of the power supply voltage supply line and power supply voltage supply terminal 31, the wiring registers 101, 102, 103 and 106 of the power supply voltage supply line exist. Between the node 44 of the ground voltage supply line and ground voltage supply terminal 41, the wiring resistors 131, 132, 133 and 136 of the ground voltage supply line exist. Between the node 34 of the power supply voltage supply line and the node 44 of the ground voltage supply line, a resistor 73 of the amplifier circuit 23 exists. The amplifier circuit 23 has a + input terminal 13, a − input terminal and an output terminal 203, and the − input terminal is electrically connected to the output terminal 203. Between the node 54 of the first reference potential supply line and first bias generation circuit 1, wiring resistors 114 and 115 of the first reference potential supply line exist. Between the node 64 of the second reference potential supply line and first bias generation circuit 1, wiring resistors 124 and 125 of the second reference potential supply line exist.

The amplifier circuit 24 is electrically connected to a node 35 of the power supply voltage supply line and a node 45 of the ground voltage supply line, and is also electrically connected to a node 55 of the first reference potential supply line and a node 65 of the second reference potential supply line.

Between the node 35 of the power supply voltage supply line and power supply voltage supply terminal 31, the wiring resistors 101, 102, 103, 104 and 106 of the power supply voltage supply line exist. Between the node 45 of the ground voltage supply line and ground voltage supply terminal 41, the wiring resistors 131, 132, 133, 134 and 136 of the ground voltage supply line exist. Between the node 35 of the power supply voltage supply line and the node 45 of the ground voltage supply line, a resistor 74 of the amplifier circuit 24 exists. The amplifier circuit 24 has a + input terminal 14, a − input terminal and an output terminal 204, and the − input terminal is electrically connected to the output terminal 204. Between the node 55 of the first reference potential supply line and the first bias generation circuit 1, a wiring resistor 115 of the first reference potential supply line exists. Between the node 65 of the second reference potential supply line and first bias generation circuit 1, a wiring resistor 125 of the second reference potential supply line exists.

The first bias generation circuit 1 is electrically connected to a node 36 of the power supply voltage supply line and a node 46 of the ground voltage supply line, and is also electrically connected to a node 56 of the first reference potential supply line and a node 66 of the second reference potential supply line. Between the node 36 of the power supply voltage supply line and power supply voltage supply terminal 31, the wiring resistors 101, 102, 103, 104, 105 and 106 of the power supply voltage supply line exist. Between the node 46 of the ground voltage supply line and ground voltage supply terminal 41, the wiring resistors 131, 132, 133, 134, 135 and 135 of the ground voltage supply line exist.

Thus, the amplifier circuit 21 is placed between the power supply voltage supply terminal 31 and ground voltage supply terminal 41 and the amplifier circuit 22. The amplifier circuit 22 is placed between the amplifier circuit 21 and the second bias generation circuit 211. The second bias generation circuit 211 is placed between the amplifier circuit 22 and the amplifier circuit 23. The amplifier circuit 23 is placed between the second bias generation circuit 211 and the amplifier circuit 24. The amplifier circuit 24 is placed between the amplifier circuit 23 and the first bias generation circuit 1.

In other words, the first bias generation circuit 1 is placed at a position such that the wiring distance (length) to the first bias generation circuit 1 from the power supply voltage supply terminal 31 and ground voltage supply terminal 41 is longer than the wiring distance (length) to the first bias generation circuit 1 from the amplifier circuits 23 and 24. The wiring distance is a length of the first constant potential supply line and the second constant potential supply line. Since the first constant potential supply line and the second constant potential supply line have wiring resistors, voltage decreases more as the wiring distance from the power supply voltage supply terminal 31 and ground voltage supply terminal 41 increases. The wiring distance from the power supply voltage supply terminal 31 and ground voltage supply terminal 41 to the nodes 36 and 46, at which the first bias generation circuit 1 is connected to the first constant potential supply line and second constant potential supply line respectively, is longer than that to the nodes 34 and 64, and nodes 35 and 65 at which the amplifier circuits 23 and 24 are connected to the first constant potential supply line and second constant potential supply line, respectively.

The second bias generation circuit 211 is placed at a position such that the wiring distance to the second bias generation circuit 211 from the power supply voltage supply terminal 31 and ground voltage supply terminal 41 is longer than the wiring distance to the second bias generation circuit 211 from the amplifier circuits 21 and 22. The wiring distance is a distance of the first constant potential supply line and the second constant potential supply line. Since the first constant potential supply line and the second constant potential supply line have wiring resistors, voltage decreases more as the wiring distance from the power supply voltage supply terminal 31 and ground voltage supply terminal 41 increases. Thus, the wiring distance from the power supply voltage supply terminal 31 and ground voltage supply terminal 41 to the nodes 37 and 47, at which the second bias generation circuit 211 is connected to the first constant potential supply line and the second constant potential supply line respectively, is longer than that to the nodes 32 and 42 and the nodes 33 and 43 at which the amplifier circuits 21 and 22 are connected to the first constant potential supply line and second constant potential supply line, respectively.

In other words, the bias generation circuit 1 is installed between the power supply voltage node 36 and ground voltage node 46, which are at the far end from the power supply voltage supply terminal 31 and ground voltage supply terminal 41, and the reference voltage node 56 and the node 66 are connected to the amplifier circuit block 3 from the far end. The bias generation circuit 211 is installed around the center between the power supply voltage node 37 and ground voltage node 47, and the reference voltage node 57 and the node 67 are connected from the center to the amplifier circuit block 2. In an actual chip layout as well, the amplifier circuit block 2 is placed closer to the power supply source, the bias generation circuit 211 is placed at or near the center, the amplifier circuit block 3 is placed more distant therefrom, and the bias generation circuit 1 is placed at the far end.

The power supply voltage of the amplifier circuit 21 in the amplifier circuit block 2 is connected (fed) to the node 32, the ground voltage is connected to the node 42, and the reference voltage is connected to the node 52 and node 62. The power supply voltage of the amplifier circuit 22 is connected to the node 33, the ground voltage is connected to the node 43, and the reference voltage is connected to the node 53 and node 63. The power supply voltage of the amplifier circuit 23 is connected to the node 34, the ground voltage is connected to the node 44, and the reference voltage is connected to the node 54 and node 64. The power supply voltage of the amplifier circuit 24 is connected to the node 35, the ground voltage is connected to the node 45, and the reference voltage is connected to the node 55 and node 65.

The wire resistors 71, 72, 73 and 74 in the amplifier circuits are illustrated in FIG. 3 for expressing the currents that flow in the amplifier circuits, which will be described later.

The power supply voltage node 31 is connected to the node 32 via the wiring resistor 101, the node 32 is connected to the node 33 via the wiring resistor 102, the node 33 is connected to the node 37 via the wiring resistor 103, the node 37 is connected to the node 34 via the wiring resistor 106, the node 34 is connected to the node 35 via the wiring resistor 104, and the node 35 is connected to the node 36 via the wiring resistor 105. The ground voltage node 41 is connected to the node 42 via the wiring resistor 131, the node 42 is connected to the node 43 via the wiring resistor 132, the node 43 is connected to the node 47 via the wiring resistor 133, the node 47 is connected to the node 44 via the wiring resistor 136, the node 44 is connected to the node 45 via the wiring resistor 134, and the node 45 is connected to the node 46 via the wiring resistor 135. The reference voltage node 56 is connected to the node 55 via the wiring resistor 115, the node 52 is connected to the node 53 via the wiring resistor 112, the node 53 is connected to the node 57 via the wiring resistor 113, and the node 54 is connected to the node 55 via the wiring resistor 114. The reference voltage node 66 is connected to the node 65 via the wiring resistor 125, the node 62 is connected to the node 63 via the wiring resistor 122, the node 63 is connected to the node 67 via the wiring resistor 123, and the node 64 is connected to the node 65 via the wiring resistor 124.

The wiring resistors 101, 102, 103, 104, 105, 106, 112, 113, 114, 115, 122, 123, 124, 125, 131, 132, 133, 134, 135 and 136 are wiring resistors inherently contained in the wiring metal. The node 52, 53, 54 and 55 is connected to a gate of a constant current source PMOS transistor in the amplifier circuit 21, 22, 23, 24, and the node 62, 63, 64, 65 is connected to a gate of a constant current source NMOS transistor in the amplifier circuit 21, 22, 23, 24.

The semiconductor integrated circuit 10' is integrated into one semiconductor chip. The bias generation circuit 1 and bias generation circuit 211 have the same characteristics. The first and second bias generation circuits 1 and 211 can have a known circuit configuration. The amplifier circuits 21 to 24 can have a known circuit configuration.

The basic operation of the semiconductor integrated circuit 10' described with reference to FIG. 3 is that the analog voltage levels of the input terminals 11, 12, 13 and 14 of the amplifier circuits are given to the corresponding output terminals 201, 202, 203 and 204 respectively, as shown in FIG. 4.

Now the relationship between the power supply voltage and ground voltage and the bias voltage according to the above described placements of the various elements of the semiconductor integrated circuit 10' will be described since the bias generation circuit 1 is placed between the power supply voltage node 36 and ground voltage node 46, the voltages at the nodes 56 and 66 are determined based on the voltages at the nodes 36 and 46.

The bias generation circuit 211 is placed between the power supply voltage node 37 and ground voltage node 47, so that the voltages at the nodes 57 and 67 are determined based on the power supply voltage at the node 37 and the ground voltage at the node 47.

Current is constantly flowing in each amplifier circuit 21 to 24, so that voltage drops at each amplifier circuit 21 to 24 (as indicated by dotted lines), and a potential difference is generated among the power supply voltage nodes 32 to 36 and among the ground voltage nodes 42 to 46. The voltage drop is particularly large in the nodes 36 and 46 which are more distant from the power supply voltage supply terminal 31 and ground voltage supply terminal 41 (i.e., more distant from the power supply side). In FIG. 4, an ideal power supply voltage 31' and ideal ground potential 41' when voltage does not drop are also indicated. Compared with the power supply voltage node 36 and ground voltage node 46, the power supply voltage node 37 and ground voltage node 47 have less influence of the voltage drop because the power supply voltage node 37 and ground voltage node 47 are closer to the power supply voltage supply terminal 31 and ground voltage supply terminal 41 (i.e., closer to the power supply side).

The wires of the reference voltage from the bias generation circuit 1 and bias generation circuit 211 are in high impedance status. Thus, voltage does not drop, and the voltage levels of the nodes 52, 53 and 57 are the same, the voltage levels of the nodes 62, 63, and 67 are the same, the voltage levels of the nodes 54, 55 and 56 are the same, and the voltage levels of the nodes 64, 65 and 66 are the same.

As described above, according to the second embodiment of the present invention, the power supply voltage node 36 and ground voltage node 46 of the bias generation circuit 1 are placed at the farthest end from the power supply voltage supply node 31 and ground voltage supply node 41. Therefore, even if power supply voltage drops due to current which constantly flows in the amplifier circuits 21 to 24 and bias generation circuits 1 and 211, the bias generation circuit 1 generates and feeds the reference voltage to the reference voltage nodes 56 and 66 based on the power supply of which voltage has dropped. Thus, of the voltages Vgs of the constant current source MOS transistors of the two amplifier circuits 23 and 24, the voltage Vgs of the amplifier circuit 24 which is closer to the bias generation circuit. 1 becomes the smaller. If the semiconductor integrated circuit is designed based on this amplifier circuit 24, the response speed of the other amplifier circuit 23 does not decrease.

The power supply voltage node 37 and ground voltage node 47 of the bias generation circuit 211 are placed approximately center between the power supply voltage supply node 31 and ground voltage supply node 41 and the farthest end therefrom, so that the bias generation circuit 211 generates and feeds a reference voltage to the reference voltage nodes 56 and 66 based on the power supply of which voltage dropped by the center level. Therefore, of the voltages Vgs of the constant current source MOS transistors of the two amplifier circuits 21 and 22, the voltage Vgs of the amplifier circuit 22 which is closer to the bias generation circuit 211 becomes the smaller. If the semiconductor integrated circuit is designed based on the amplifier circuit 22, the response speed of the other amplifier circuit 21 does not decrease.

The bias generation circuit 211 is installed at approximately center between the power supply voltage supply terminal 31 and ground voltage supply terminal 41 (i.e., the terminals at the power supply side) and the farthest end therefrom, so that current consumption at the amplifier circuits 21 and 22 decreases more effectively than generating a reference voltage at the farthest end from the power supply voltage supply terminal 31 and ground voltage supply terminal 41 (i.e., from the power supply side).

Even if the wiring resistance finish values change because of the process variation of the power supply wiring resistance, the potential difference between the power supply voltage node 36 and reference voltage node 56 is substantially unchanged, i.e., the potential difference 551 when the wiring resistance value is high (FIG. 4) and the potential difference 511' when the wiring resistance value is low (FIG. 4) are approximately the same. Also, the potential difference between the ground voltage node 46 and reference voltage node 66 is substantially unchanged, i.e., the potential difference 512 when the wiring resistance value is high (FIG. 4) and the potential difference 512' when the wiring resistance value is low (FIG. 4) are approximately the same. Therefore, the voltage Vgs of the constant current source MOS transistor in the amplifier circuit 23, that is the potential difference 551, 551', 552 and 552' in FIG. 4 are higher than the voltage Vgs of the constant current source MOS transistor in the amplifier circuit 24. Thus, the response speed does not decrease.

The potential difference of the reference voltage node 57 is substantially unchanged, i.e., the potential difference 541 when the wiring resistance value is higher in FIG. 4 and the potential difference 541' when it is lower in FIG. 4 are approximately the same. The potential difference of the reference voltage node 67 is substantially unchanged, i.e., the potential difference 542 when the wiring resistance value is higher in FIG. 4 and potential difference 542' when it is lower in FIG. 4 are approximately the same. Thus, the voltage Vgs of the constant current source MOS transistor in the amplifier circuit 21, that is the potential difference 531, 531', 532 and 532' in FIG. 4, are higher than the voltage Vgs of the constant current source MOS transistor in the amplifier circuit 22. Therefore, the response speed does not decrease.

If the semiconductor integrated circuit is designed on the assumption that the wiring resistance is rather high, the voltage Vgs of the constant current source MOS transistor near the power supply voltage supply terminal 31 and ground voltage supply terminal 41 (i.e., near the power supply side), that is at a distance from the bias generation circuits 1 and 211, is small even if the wiring resistance value is in fact low. Thus, current consumption decreases.

(3) Third Embodiment

Figure 5:
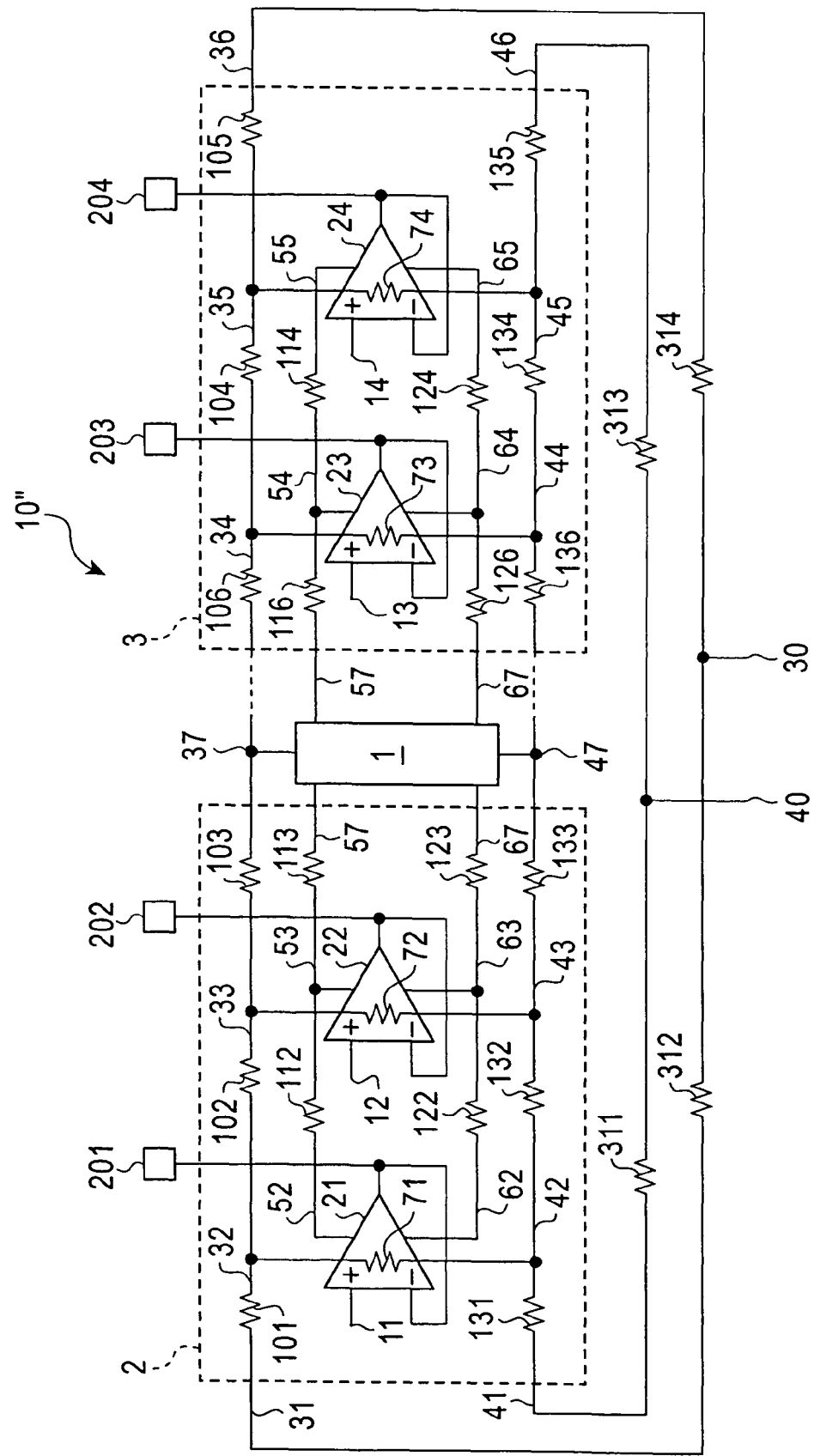
FIG. 5 is an equivalent circuit diagram depicting the circuit layout of the semiconductor integrated circuit according to the third embodiment of the present invention.
Figure 6:
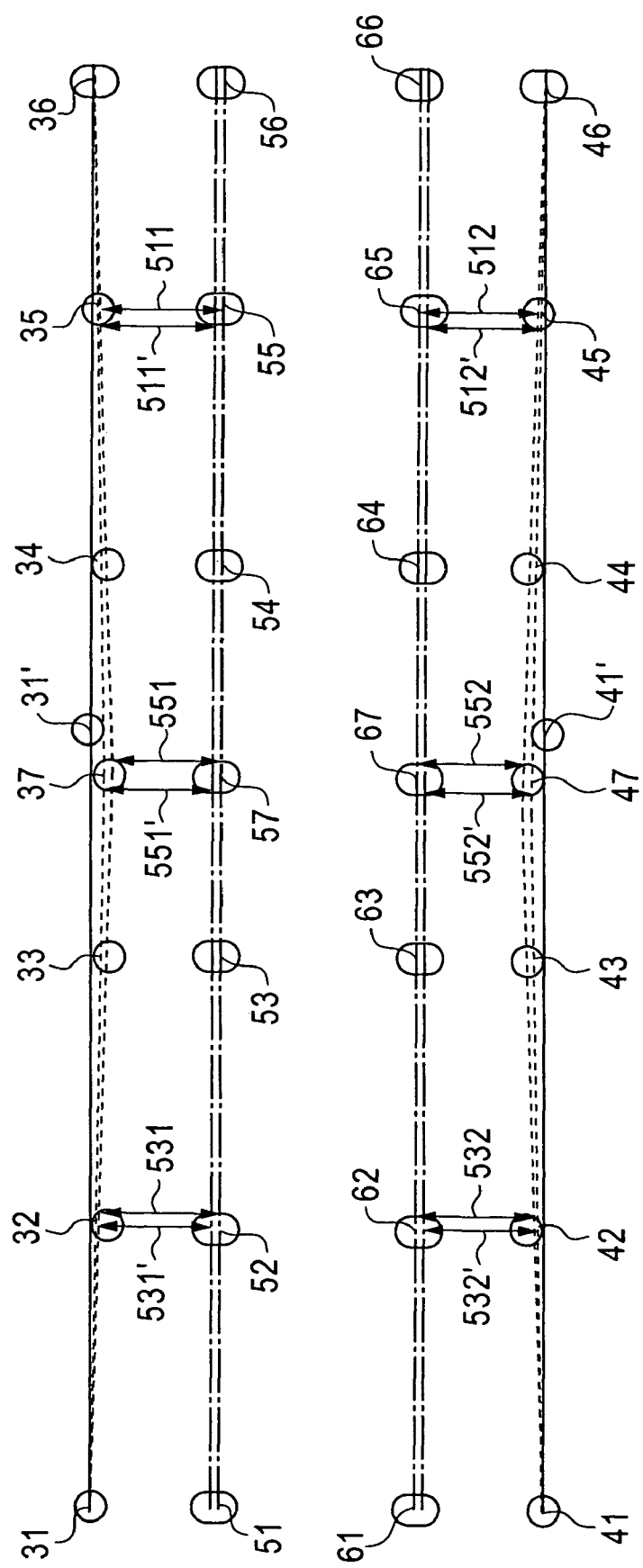
FIG. 6 is a diagram depicting the relationship between the power supply voltage and ground voltage and the reference bias voltage in the circuit layout in FIG. 5.

Referring to FIGS. 5 and 6, the third embodiment of the present invention will be described. The third embodiment is directed to a semiconductor integrated circuit 10" that is useful to suppress the influence of the process variation of wiring resistance on characteristics of the semiconductor integrated circuit. FIG. 5 is an equivalent circuit diagram depicting a circuit layout of a semiconductor integrated circuit 10" according to the third embodiment of the present invention. FIG. 6 depicts the relationship between the power supply voltage and ground voltage and the reference bias voltage in the circuit layout of FIG. 5. Similar reference numerals are used in the first to third embodiments to designate similar elements.

As FIG. 5 shows, the semiconductor integrated circuit 10" according to the third embodiment has the following circuit configuration. A first constant potential supply line has a first constant potential supply terminal, and supplies first constant potential. The first constant potential supply line can be a known power supply voltage supply line. The first constant potential supply terminal can be a power supply voltage supply terminal 30. A second constant potential supply line has a second constant potential supply terminal, and supplies second constant potential. The second constant potential is different from the first constant potential. The second constant potential supply line can be a known ground voltage supply line. The second constant potential supply terminal is, for example, the ground voltage supply terminal 40.

A first bias generation circuit 1 is electrically connected to the first constant potential supply line and second constant potential supply line, and generates first reference potential and second reference potential based on the first constant potential and the second constant potential respectively. The first bias generation circuit 1 is electrically connected to a node 37 of the power supply voltage supply line and a node 47 of the ground voltage supply line. The node 37 of the power supply voltage supply line and the node 47 of the ground voltage supply line are far end nodes from the power supply voltage supply terminal 30 and ground voltage supply terminal 40, respectively. The first bias generation circuit 1 generates first reference potential and second reference potential based on the power supply voltage supplied from the power supply voltage supply terminal 30 and ground voltage supplied from the ground voltage supply terminal 40.

A first reference potential line has a node 57, and is electrically connected to the first bias generation circuit 1 at the node 57. The first reference potential line supplies the first reference potential generated by the first bias generation circuit 1. A second reference potential line has a node 67, and is electrically connected to the first bias generation circuit 1 at the node 67. The second reference potential line supplies the second reference potential generated by the first bias generation circuit 1.

A first analog circuit block 2 is placed between the first bias generation circuit 1 and the power supply voltage supply terminal 30 and ground voltage supply terminal 40. The first analog circuit block 2 is electrically connected to the first bias generation circuit 1 via a node 37 of the power supply voltage supply line and a node 47 of the ground voltage supply line. The first analog circuit block 2 is electrically connected to the power supply voltage supply terminal 30 and ground voltage supply terminal 40 via a node 31 of the power supply voltage supply line and a node 41 of the ground voltage supply line. Between the node 31 of the power supply voltage supply line and the power supply voltage supply terminal 30, a wiring resistor 312 of the power supply voltage supply line exists. Between the node 41 of the ground voltage supply line and the ground voltage supply terminal 40, a wiring resistor 311 of the ground voltage supply line exists. The first analog circuit block 2 includes one or more analog circuits. These analog circuits are electrically connected to the first constant potential supply line and the second constant potential supply line, and are also electrically connected to the first reference potential line and the second reference potential line. The analog circuits are placed between the first and second constant potential supply terminals and first bias generation circuit 1. Each analog circuit can be a known analog circuit, such as an amplifier circuit, which operates receiving a first constant potential, second constant potential, first reference potential and second reference potential, but is not limited to such amplifier circuit. The analog circuits can include amplifier circuits 21 and 22. These analog circuits are placed between the first bias generation circuit 1 and the nodes 31 and 41. The amplifier circuits 21 and 22 are placed between the first bias generation circuit 1 and the nodes 31 and 41.

The amplifier circuit 21 is electrically connected to a node 32 of the power supply voltage supply line and a node 42 of the ground voltage supply line, and is also electrically connected to a node 52 of the first reference potential supply line and a node 62 of the second reference potential supply line. Between the node 32 of the power supply voltage supply line and power supply voltage supply terminal 30, wiring resistors 101 and 312 of the power supply voltage supply line exist. Between the node 42 of the ground voltage supply line and ground voltage supply terminal 40, the wiring resistors 131 and 311 of the ground voltage supply line exist. Between the node 32 of the power supply voltage supply line and node 42 of the ground voltage supply line, a resistor 71 of the amplifier circuit 21 exists. The amplifier circuit 21 has a + input terminal 11, a − input terminal and an output terminal 201, and the − input terminal is electrically connected to the output terminal 201. Between the node 52 of the first reference potential supply line and first bias generation circuit 1, wiring resistors 112 and 113 of the first reference potential supply line exist. Between the node 62 of the second reference potential supply line and first bias generation circuit 1, wiring resistors 122 and 123 of the second reference potential supply line exist.

The amplifier circuit 22 is electrically connected to a node 33 of the power supply voltage supply line and a node 43 of the ground voltage supply line, and is also electrically connected to a node 53 of the first reference potential supply line and a node 63 of the second reference potential supply line. Between the node 33 of the power supply voltage supply line and the power supply voltage supply terminal 30, the wiring resistors 101, 102 and 312 of the power supply voltage supply line exist. Between the node 43 of the ground voltage supply line and the ground voltage supply terminal 40, wiring resistors 131, 132 and 311 of the ground voltage supply line exist. Between the node 33 of the power supply voltage supply line and the node 43 of the ground voltage supply line, a resistor 72 of the amplifier circuit 22 exists. The amplifier circuit 22 has a + input terminal 12, a − input terminal and an output terminal 202, and the − input terminal is electrically connected to the output terminal 202. Between the node 53 of the first reference potential supply line and the first bias generation circuit 1, a wiring resistor 113 of the first reference potential supply line exists. Between the node 63 of the second reference potential supply line and first bias generation circuit 1, a wiring resistor 123 of the second reference potential supply line exists.

A second analog circuit block 3 is placed between the first bias generation circuit 1, and the power supply voltage supply terminal 30 and ground voltage supply terminal 40. In other words, the first bias generation circuit 1 is placed between the first analog circuit block 2 and the second analog circuit block 3. The second analog circuit block 3 is electrically connected to the first bias generation circuit 1 via a node 37 of the power supply voltage supply line and a node 47 of the ground voltage supply line. The second analog circuit block 3 is electrically connected to the power supply voltage supply terminal 30 and ground voltage supply terminal 40 via a node 36 of the power supply voltage supply line and a node 46 of the ground voltage supply line. Between the node 36 of the power supply voltage supply line and the power supply voltage supply terminal 30, a wiring resistor 314 of the power supply voltage supply line exists. Between the node 46 of the ground voltage supply line and the ground voltage supply terminal 40, a wiring resistor 313 of the ground voltage supply line exists. The second analog circuit block 3 includes one or more analog circuits. These analog circuits are electrically connected to the first constant potential supply line and the second constant potential supply line, and are also electrically connected to the first reference potential line and second reference potential line. The analog circuits are placed between the first and second constant potential supply terminals and the first bias generation circuit 1. Each analog circuit can be a known analog circuit, such as an amplifier circuit, which operates receiving a first constant potential, second constant potential, first reference potential and second reference potential, but is not limited to such amplifier circuit. For example, the analog circuits include amplifier circuits 23 and 24. The analog circuits are placed between the first bias generation circuit 1 and the nodes 36 and 46. Specifically, the amplifier circuits 23 and 24 are placed between the first bias generation circuit 1 and the nodes 36 and 46.

The amplifier circuit 23 is electrically connected to a node 34 of the power supply voltage supply line and a node 44 of the ground voltage supply line, and is also electrically connected to a node 54 of the first reference potential supply line and a node 64 of the second reference potential supply line. Between the node 34 of the power supply voltage supply line and the power supply voltage supply terminal 30, the wiring resistors 104, 105 and 314 of the power supply voltage supply line exist. Between the node 44 of the ground voltage supply line and the ground voltage supply terminal 40, the wiring resistors 134, 135 and 313 of the ground voltage supply line exist. Between the node 34 of the power supply voltage supply line and a node 44 of the ground voltage supply line, a resistor 73 of the amplifier circuit 23 exists. The amplifier circuit 23 has a + input terminal 13, a – input terminal and an output terminal 203, and the – input terminal is electrically connected to the output terminal 203. Between the node 54 of the first reference potential supply line and the first bias generation circuit 1, a wiring resistor 116 of the first reference potential supply line exists. Between the node 64 of the second reference potential supply line and the first bias generation circuit 1, a wiring resistor 126 of the second reference potential supply line exists.

The amplifier circuit 24 is electrically connected to a node 35 of the power supply voltage supply line and a node 45 of the ground voltage supply line, and is also electrically connected to a node 55 of the first reference potential supply line and a node 65 of the second reference potential supply line. Between the node 35 of the power supply voltage supply line and the power supply voltage supply terminal 30, the wiring resistors 105 and 314 of the power supply voltage supply line exist. Between the node 45 of the ground voltage supply line and the ground voltage supply terminal 40, the wiring resistors 135 and 313 of the ground voltage supply line exist. Between the node 35 of the power supply voltage supply line and the node 45 of the ground voltage supply line, a resistor 74 of the amplifier circuit 24 exists. The amplifier circuit 24 has a + input terminal 14, a – input terminal and an output terminal 204, and the – input terminal is electrically connected to the output terminal 204. Between the node 55 of the first reference potential supply line and first bias generation circuit 1, the wiring resistors 114 and 116 of the first reference potential supply line exist. Between the node 65 of the second reference potential supply line and the first bias generation circuit 1, wiring resistors 124 and 126 of the second reference potential supply line exist.

The first bias generation circuit 1 is electrically connected to a node 37 of the power supply voltage supply line and a node 47 of the ground voltage supply line, and is also electrically connected to a node 57 of the first reference potential supply line and a node 67 of the second reference potential supply line. Between the node 37 and node 31 of the power supply voltage supply line, the wiring resistors 101, 102 and 103 of the power supply voltage supply line exist. Between the node 37 and node 36 of the power supply voltage supply line, the wiring resistors 104, 105 and 106 of the power supply voltage supply line exist. Between the node 47 and node 41 of the ground voltage supply line, the wiring resistors 131, 132 and 133 of the ground voltage supply line exist. Between the node 47 and node 46 of the ground voltage supply line, the wiring resistors 134, 135 and 136 of the ground voltage supply line exist.

Thus, the amplifier circuit 21 is placed between the power supply voltage supply terminal 30 and ground voltage supply terminal 40 and the amplifier circuit 22. The amplifier circuit 22 is placed between the amplifier circuit 21 and the first bias generation circuit 1. The amplifier circuit 23 is placed between the first bias generation circuit 1 and the amplifier circuit 24. The amplifier circuit 24 is placed between the amplifier circuit 23 and the power supply voltage supply terminal 30 and ground voltage supply terminal 40.

In other words, the first bias generation circuit 1 is placed at a position such the wiring distance (length) to the first bias generation circuit 1 from the power supply voltage supply terminal 30 and ground voltage supply terminal 40 is longer than the wiring distance (length) to the first bias generation circuit 1 from the amplifiers 21 to 24. The wiring distance is a length of the first constant potential supply line and second constant potential supply line. Since the first constant potential supply line and the second constant potential supply line have wiring resistors, voltage decreases more as the wiring distance from the power supply voltage supply terminal 30 and ground voltage supply terminal 40 increases. In other words, the wiring distance from the power supply voltage supply terminal 30 and ground voltage supply terminal 40 to the nodes 37 and 47 at which the first bias generation circuit 1 is connected to the first constant potential supply line and the second constant potential supply line respectively, is longer than that to the nodes 32 and 42, nodes 33 and 43, nodes 34 and 44 and nodes 35 and 45, at which the amplifier circuits 21 to 24 are connected to the first constant potential supply line and the second constant potential supply line respectively.

The amplifier circuit block 2, bias generation circuit 1 and amplifier circuit block 3 are installed, the power supply voltage node 31 of the amplifier circuit block 2 is connected to the power supply voltage supply terminal 30 via the wiring resistor 312; the ground voltage node 41 is connected to the ground voltage supply terminal 40 via the wire resistor 311, the power supply voltage node 36 of the amplifier circuit block 3 is connected to the power supply voltage supply terminal 30 via the wiring resistor 314, and the ground voltage node 46 is connected to the ground supply terminal 40 via the wiring resistor 313.

The power supply voltage of the amplifier circuit 21 in the amplifier circuit block 2 is connected to the node 32, the ground voltage is connected to the node 42, and the reference voltage is connected to the node 52 and node 62. The power supply voltage of the amplifier circuit 22 is connected to the node 33, the ground voltage is connected to the node 43, and the reference voltage is connected to the node 53 and node 63. The power supply voltage of the amplifier circuit 23 is connected to the node 34, the ground voltage is connected to the node 44, and the reference voltage is connected to the node 54 and node 64. The power supply voltage of the amplifier circuit 24 is connected to the node 35, the ground voltage is connected to the node 45, and the reference voltage is connected to the node 55 and node 65.

The wiring resistors 71, 72, 73 and 74 in the amplifier circuits 21, 22, 23 and 24 are illustrated in the drawing for expressing the currents that flow in the amplifier circuits, which will be described later.

The power supply voltage node 31 is connected to the node 32 via the wiring resistor 101. The node 32 is connected to the node 33 via the wiring resistor 102, the node 33 is connected to the node 37 via the wiring resistor 103, the node 37 is connected to the node 34 via the wiring resistor 106, the node 34 is connected to the node 35 via the wiring resistor 104, and the node 35 is connected to the node 36 via the wiring resistor 105. The ground voltage node 41 is connected to the node 42 via the wiring resistor 131, the node 42 is connected to the node 43 via the wiring resistor 132, the node 43 is connected to the node 47 via the wiring resistor 133, the node 47 is connected to the node 44 via the wiring resistor 136, the node 44 is connected to the node 45 via the wiring resistor 134, and the node 45 is connected to the node 46 via the wiring resistor 135. The reference voltage node 52 is connected to the node 53 via the wiring resistor 112, the node 53 is connected to the node 57 via the wiring resistor 113, the node 57 is connected to the node 54 via the wiring resistor 116, and the node 54 is connected to the node 55 via the wiring resistor 114. The reference voltage node 62 is connected to the node 63 via the wiring resistor 122, the node 63 is connected to the node 67 via the wiring resistor 123, the node 67 is connected to the node 64 via the wiring resistor 126, and the node 64 is connected to the node 65 via the wiring resistor 124.

The wiring resistors 101, 102, 103, 104, 105, 106, 112, 113, 114, 122, 123, 124, 126, 131, 132, 133, 134, 135, 136, 311, 312, 313 and 314 are wiring resistors inherently contained in the wiring metal. The node 52, 53, 54, 55 is connected to a gate of a constant current source PMOS transistor in each amplifier circuit 21, 22, 23, 24, and the node 62, 63, 64, 65 is connected to a gate of a constant current source NMOS transistor in each amplifier circuit 21, 22, 23, 24.

In an actual chip layout, the bias generation circuit 1 is placed between the amplifier circuit block 2 and amplifier circuit block 3, and the total of wiring resistance from the power supply voltage supply terminal 30 to the node 37 via the node 31, node 32 and node 33 is equal to the total of the wiring resistance from the power supply voltage supply terminal 30 to the node 37 via the node 36, node 35 and node 34. Likewise, the total of the wiring resistance from the ground voltage supply terminal 40 to the node 47 via the node 41, node 42 and node 43 is equal to the total of the wiring resistance from the ground voltage supply terminal 40 to the node 47 via the node 46, node 45 and node 44. Therefore, the position of the bias generation circuit 1 is the farthest end from the power supply voltage supply terminal 30 and ground voltage supply terminal 40.

The semiconductor integrated circuit 10" is integrated into one semiconductor chip. The first bias generation circuit 1 can have a known circuit configuration. Also each of the amplifier circuits 21 to 24 can have a known circuit configuration.

In the semiconductor integrated circuit 10" described with reference to FIG. 5, the basic operation is that the analog voltage level of the input terminal 11, 12, 13, 14 of each amplifier circuit is fed to the associated output terminal 201, 202, 203, 204, as shown in FIG. 6.

Now the relationship between the power supply voltage and ground voltage and the bias voltage according to the placements of various elements of the semiconductor integrated circuit 10" will be described. Since the bias generation circuit 1 is placed between the power supply voltage node 37 and ground voltage node 47, the reference voltages at the nodes 57 and 67 are determined based on the power supply voltage at the node 37 and the ground voltage at the node 47.

Current is constantly flowing in each amplifier circuit 21 to 24, so that voltage drops at each amplifier circuit 21 to 24 (as indicated by dotted lines), and a potential difference is generated among the power supply voltage nodes 32, 33, 34, 35, 36 and 37 and among the ground voltage nodes 42, 43, 44, 45, 46 and 47. The voltage drop is particularly large in the node 37 and node 47, which are more distant from the power supply voltage supply terminal 30 and ground voltage supply terminal 40 (i.e., more distant from the power supply side). An ideal power supply voltage 31' and ideal ground potential 41', i.e., when no voltage drop occurs, are also indicated in FIG. 6.

Wires of the reference voltage from the bias generation circuit 1 are in high impedance status, so that voltage does not drop, the voltage levels of the nodes 52, 53, 57, 54 and 55 are the same, and the voltage levels of the nodes 62, 63, 67, 64 and 65 are the same.

As described above, according to the third embodiment of the present invention, the power supply voltage node 37 and ground voltage node 47 of the bias generation circuit 1 are placed at the farthest end from the power supply voltage supply node 30 and ground voltage supply node 40. Thus, even if the power supply voltage drops due to the current which constantly flows in the amplifier circuits 21 to 24 and bias generation circuit 1, the bias generation circuit 1 generates the reference voltage to the reference voltage nodes 57 and 67 based on the power supply of which voltage has dropped. Therefore, among the amplifier circuits 21 to 24, the voltage Vgs of the constant current source MOS transistor of the amplifier circuits 22 and 23, which are closer to the bias generation circuit 1, becomes lower. If the semiconductor integrated circuit is designed based on the amplifier circuits 22 and 23, the response speed of the other amplifier circuits 21 and 24 does not decrease.

The bias generation circuit 1, which is common to the amplifier circuit block 2 and amplifier circuit block 3, is placed between the amplifier circuit block 2 and amplifier circuit block 3, and is separated from the power supply voltage supply node 30 and ground voltage supply node 40 by the amplifier circuit block 2 and amplifier circuit block 3. Therefore, the response speed at the amplifier circuits 21 to 24 become approximately symmetric with respect to the bias generation circuit 1. Specifically, the response speed is approximately the same for the amplifier circuit 21 and amplifier circuit 24, and the response speed is approximately the same for the amplifier circuit 22 and amplifier circuit 23.

Even if the wiring resistance finish values change because of the process variation of the power supply wiring resistance, the potential difference between the power supply voltage node 37 and reference voltage node 57 is substantially unchanged, i.e., the potential difference 551 when the wiring resistance value is high in FIG. 6 and the potential difference 551' when it is low in FIG. 6 are approximately the same. Also, the potential difference between the ground voltage node 47 and reference voltage node 67 is substantially unchanged, i.e., the potential difference 552 when the wiring resistance value is high in FIG. 6 and the potential difference 552' when it is low in FIG. 6 are approximately the same. Thus, the voltage Vgs of the constant current source MOS transistor in the amplifier circuit 21, that is the potential differences 531, 531', 532 and 532' in FIG. 6, is higher than the voltage Vgs of the constant current source MOS transistor in the amplifier circuit 22. Accordingly, the response speed does not decrease. The voltage Vgs of the constant current source MOS transistor of the amplifier circuit 24, i.e., the potential differences 511, 511', 512 and 512' in FIG. 6, is higher than the voltage Vgs of the constant current source MOS transistor in the amplifier circuit 23, so that the response speed does not decrease.

If the semiconductor integrated circuit 10" is designed on the assumption that the wiring resistance is rather high, the voltage Vgs of the-constant current source MOS transistor near the power supply voltage supply terminal 30 and ground voltage supply terminal 40 (i.e., near the power supply side), that is distant from the bias generation circuit 1, is small, even if the wiring resistance value is in fact low. Accordingly, current consumption decreases.

(4) Modifications

In the above described first to third embodiments, a maximum of two bias generation circuits are installed, but the number of bias generation circuits is not limited, as long as an amplifier circuit that uses a reference voltage generated by a bias generation circuit is placed between the power supply voltage supply terminal and ground voltage supply terminal and the bias generation circuit.

In the third embodiment, there is one power supply voltage supply terminal and one ground voltage supply terminal for the two amplifier circuit blocks 2 and 3, and the power supply voltage and ground voltage are supplied from these supply terminals to the two amplifier circuit blocks 2 and 3. Alternatively, two power supply voltage supply terminals and two ground voltage supply terminals may be provided for the two amplifier circuit blocks 2 and 3, so as to separately supply power to the amplifier circuit blocks. In this case, wiring resistance from the branching points of the power supply and ground outside the semiconductor integrated circuit must be the same for the two amplifier circuit blocks 2 and 3.

In the semiconductor integrated circuits in the first to third embodiments, the reference voltage generated by the bias generation circuit is supplied to the amplifier circuits, but the present invention is not limited in this regard. For example, the reference voltage generated by the bias generation circuit may be supplied to other analog circuits.

In the first to third embodiments, the bias generation circuit generates the reference voltage based on the power supply potential and ground potential. Alternatively, the bias generation circuit may generate a first and second reference potentials, which are different from each other, based on the first and second constant potentials, which are different from each other. Use of the potentials indicated in the illustrated embodiments is not always necessary for generation of the first and second reference potentials.

In the first to third embodiments, the voltage is dropped using wiring resistors, but voltage may be dropped using element resistors in addition to or instead of the wiring resistors.

This application is based on Japanese Patent Application No. 2005-274874 filed on Sep. 22, 2005 and the entire disclosure thereof is incorporated herein by reference.

What is claimed is:

1. A semiconductor integrated circuit comprising:
a first potential supply line having a first potential supply terminal at a first end thereof and a first node at an opposite end thereof, for supplying a first potential, said first potential decreases as said first potential is transmitted through said first potential supply line from said first end to said first node;
a second potential supply line having a second potential supply terminal at a second end thereof and a second node at an opposite end thereof, for supplying a second potential, said second potential decreases as said second potential is transmitted through said second potential supply line from said second end to said second node;
a first bias generation circuit electrically connected to said first node of said first potential supply line and to said second node of said second potential supply line, for receiving said decreased first potential and said decreased second potential to generate a first reference potential and a second reference potential based on said decreased first potential and said decreased second potential, respectively;
a first reference potential line electrically connected to said first bias generation circuit, for supplying said first reference potential from said first bias generation circuit;
a second reference potential line electrically connected to said first bias generation circuit, for supplying said second reference potential from said first bias generation circuit; and
a first analog circuit electrically connected to said first potential supply line, said second potential supply line, said first reference potential line and said second reference potential line, and placed between said first and second potential supply terminals and said first bias generation circuit, such that a distance from said first bias generation circuit to the first potential supply terminal is larger than a distance from said first analog circuit to the first potential supply terminal and so that said decreased first potential having a most decreased value is provided to said first bias generation circuit, and such that a distance from said first bias generation circuit to the second potential supply terminal is larger than a distance from said first analog circuit to the second potential supply terminal and so that said decreased second potential having a most decreased value is provided to said first bias generation circuit, said first analog circuit receiving the first reference potential from said first bias generation circuit and receiving the second reference potential from said first bias generation circuit.

2. The semiconductor integrated circuit according to claim 1, wherein said first bias generation circuit has a first resistor connected with said first potential supply terminal, and a second resistor connected with said second potential supply terminal, and said first analog circuit has a third resistor which has lower resistance than said first resistor and is connected with said first potential supply terminal, and a fourth resistor which has lower resistance than said second resistor and is connected with said second potential supply terminal.

3. The semiconductor integrated circuit according to claim 2, wherein said first resistor, said second resistor, said third resistor and said fourth resistor are wiring resistors.

4. The semiconductor integrated circuit according to claim 1, further comprising a second analog circuit electrically connected to said first potential supply line, said second potential supply line, said first reference potential line and said second reference potential line, and placed between said first analog circuit and said first bias generation circuit.

5. The semiconductor integrated circuit according to claim 2, further comprising a second analog circuit that is electrically connected to said first potential supply line, said second potential supply line, said first reference potential line and said second reference potential line, and has a fifth resistor and a sixth resistor, wherein the fifth resistor has lower resistance than said first resistor and higher resistance than said third resistor and is connected with said first potential supply terminal, and the sixth resistor has lower resistance than said second resistor and higher resistance than said fourth resistor and is connected with said second potential supply terminal.

6. The semiconductor integrated circuit according to claim 5, wherein said fifth resistor and said sixth resistor are wiring resistors.

7. The semiconductor integrated circuit according to claim 4, wherein said second analog circuit is connected to said first potential supply line at a fourth node that is closer to said first bias generation circuit than a third node at which said first analog circuit is connected to said first potential supply line, is connected to said second potential supply line at a sixth node that is closer to said first bias generation circuit than a fifth node at which said first analog circuit is connected to said second potential supply line, is connected to said first reference potential line at an eighth node that is closer to said first bias generation circuit than a seventh node at which said first analog circuit is connected to said first reference potential line, and is connected to said second reference potential line at a tenth node that is closer to said first bias generation circuit than a ninth node at which said first analog circuit is connected to said second reference potential line.

8. The semiconductor integrated circuit according to claim 4, wherein said first analog circuit and said second analog circuit are amplification circuits respectively.

9. The semiconductor integrated circuit according to claim 1, wherein said first bias generation circuit, said first analog circuit and said second analog circuit are integrated onto a single chip.

10. The semiconductor integrated circuit according to claim 1, further comprising:

a second bias generation circuit that is electrically connected to said first potential supply line and said second potential supply line, that adjusts said first potential and said second potential to generate a third reference potential and fourth reference potential based on said first potential and said second potential, respectively, and is placed between said first analog circuit and said first and second potential supply terminals;

a third reference potential line electrically connected to said second bias generation circuit, for supplying said third reference potential from said second bias generation circuit;

a fourth reference potential line electrically connected to said second bias generation circuit, for supplying said fourth reference potential from said second bias generation circuit;

a third analog circuit electrically connected to said first potential supply line, said second potential supply line, said third reference potential line and said fourth reference potential line, and placed between said first and second potential supply terminals and said second bias generation circuit; and a fourth analog circuit electrically connected to said first potential supply line, said second potential supply line, said third reference potential line and said fourth reference potential line, and placed between said first and second potential supply terminals and said third analog circuit.

11. The semiconductor integrated circuit according to claim 10, wherein said first bias generation circuit, said first analog circuit, said second analog circuit, said second bias generation circuit, said third analog circuit and said fourth analog circuit are integrated onto a single chip.

12. The semiconductor integrated circuit according to claim 4, further comprising:

a third analog circuit electrically connected to said first potential supply line, said second potential supply line, said first reference potential line and said second reference potential line, and placed between said first and second potential supply terminals and said first bias generation circuit; and a fourth analog circuit electrically connected to said first potential supply line, said second potential supply line, said first reference potential line and said second reference potential line, and placed between said first and second potential supply terminals and said third analog circuit.

13. The semiconductor integrated circuit according to claim 12, wherein said first bias generation circuit, said first analog circuit, said second analog circuit, said third analog circuit, and said fourth analog circuit are integrated onto a single chip.

14. A semiconductor integrated circuit comprising:

a first potential supply line having a first potential supply terminal at a first end thereof and a first node at an opposite end thereof, for supplying a first potential, said first potential decreases as said first potential is transmitted through said first potential supply line from said first end to said first node;

a second potential supply line having a second potential supply terminal at a second end thereof and a second node at an opposite end thereof, for supplying a second potential, said second potential decreases as said second potential is transmitted through said second potential supply line from said second end to said second node;

a first bias generation circuit that is electrically connected to the first node of said first potential supply line and to the second node of said second potential supply line, has a first resistor connected with said first potential supply terminal, has a second resistor connected with said second potential supply terminal, and receives said decreased first potential and said decreased second potential to generate a first reference potential and a second reference potential based on said decreased first potential and said decreased second potential;

a first reference potential line electrically connected to said first bias generation circuit, for supplying said first reference potential from said first bias generation circuit;

a second reference potential line electrically connected to said first bias generation circuit, for supplying said second reference potential from said first bias generation circuit; and a first analog circuit that is electrically connected to said first potential supply line, said second potential supply line, said first reference potential line and said second reference potential line, has a third resistor which has lower resistance than said first resistor and is connected with said first potential supply terminal so that said decreased first potential having a most decreased value is provided to said first bias generation circuit, and has a fourth resistor which has lower resistance than said second resistor and is connected with said second potential supply terminal so that said decreased second potential having a most decreased value is provided to the first bias generation circuit, said first analog circuit receiving the first reference potential from said first bias generation circuit and also receiving the second reference potential from said first bias generation circuit.

15. The semiconductor integrated circuit according to claim 14, wherein said first resistor, said second resistor, said third resistor and said fourth resistor are wiring resistors.

16. The semiconductor integrated circuit according to claim 14, wherein said first analog circuit is placed between said first and second potential supply terminals and said first bias generation circuit.

17. The semiconductor integrated circuit according to claim 14, further comprising a second analog circuit that is electrically connected to said first potential supply line, said second potential supply line, said first reference potential line and said second reference potential line, and has a fifth resistor and a sixth resistor, wherein the fifth resistor has lower resistance than said first resistor and higher than said third resistor and is connected with said first potential supply terminal, and the sixth resistor has lower resistance than said second resistor and higher than said fourth resistor and is connected with said second potential supply terminal.

18. The semiconductor integrated circuit according to claim 17, wherein said fifth resistor and said sixth resistor are wiring resistors.

19. The semiconductor integrated circuit according to claim 14, further comprising a second analog circuit electrically connected to said first potential supply line, said second potential supply line, said first reference potential line and said second reference potential line, and placed between said first analog circuit and said first bias generation circuit.

20. The semiconductor integrated circuit according to claim 17, wherein said second analog circuit is connected to said first potential supply line at a fourth node that is closer to said first bias generation circuit than a second node at which said first analog circuit is connected to said first potential supply line, is connected to said second potential supply line at a sixth node that is closer to said first bias generation circuit than a fifth node at which said first analog circuit is connected to said second potential supply line, is connected to said first reference potential line at an eighth node that is closer to said first bias generation circuit than a seventh node at which said first analog circuit is connected to said first reference potential line, and is connected to said second reference potential line at a tenth node that is closer to said first bias generation circuit than a ninth node at which said first analog circuit is connected to said second reference potential line.

21. The semiconductor integrated circuit according to claim 17, wherein said first analog circuit and said second analog circuit are amplification circuits respectively.

22. The semiconductor integrated circuit according to claim 17, wherein said first bias generation circuit, said first analog circuit and said second analog circuit are integrated onto a single chip.

23. The semiconductor integrated circuit according to claim 17, further comprising:

a second bias generation circuit, that is electrically connected to said first potential supply line and said second potential supply line, has a seventh resistor which has lower resistance than said third resistor and is connected with said first potential supply terminal, has an eighth resistor which has lower resistance than said fourth resistor and is connected with said second potential supply terminal, and generates a third reference potential and a fourth reference potential based on said first potential and said second potential;

a third reference potential line electrically connected to said second bias generation circuit, for supplying said third reference potential;

a fourth reference potential line electrically connected to said second bias generation circuit, for supplying said fourth reference potential;

a third analog circuit, that is electrically connected to said first potential supply line, said second potential supply line, said third reference potential line and said fourth reference potential line, has a ninth resistor which has lower resistance than said seventh resistor and is connected with said first potential supply terminal, and has a tenth resistor which has lower resistance than said eighth resistor and is connected with said second potential supply terminal; and a fourth analog circuit, that is electrically connected to said first potential supply line, said second potential supply line, said third reference potential line and said fourth reference potential line, has an eleventh resistor which has lower resistance than said ninth resistor and is connected with said first potential supply terminal, and has a twelfth resistor which has lower resistance than said tenth resistor and is connected with said second potential supply terminal.

24. The semiconductor integrated circuit according to claim 23, wherein said first bias generation circuit, said first analog circuit, said second analog circuit, said second bias generation circuit, said third analog circuit and said fourth analog circuit are integrated onto a single chip.

25. The semiconductor integrated circuit according to claim 17, further comprising:

a third analog circuit that is electrically connected to said first potential supply line, said second potential supply line, said first reference potential line and said second reference potential line, has a seventh resistor which has lower resistance than said first resistor and is connected with said first potential supply terminal, and has an eighth resistor, which has lower resistance than said second resistor and is connected with said second potential supply terminal; and a fourth analog circuit, that is electrically connected to said first potential supply line, said second potential supply line, said first reference potential line and said second reference potential line, has a ninth resistor which has lower resistance than said seventh resistor and is connected with said first potential supply terminal, and has a tenth resistor which has lower resistance than said eighth resistor and is connected with said second potential supply terminal.

26. The semiconductor integrated circuit according to claim 25, wherein said first bias generation circuit, said first analog circuit, said second analog circuit, said third analog circuit and said fourth analog circuit are integrated onto a single chip.

* * * * *